United States Patent
Tsai

(10) Patent No.: US 7,719,327 B2
(45) Date of Patent: May 18, 2010

(54) LOW-NOISE FREQUENCY DIVIDER

(75) Inventor: Ming-Da Tsai, Miaoli County (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 11/674,273

(22) Filed: Feb. 13, 2007

(65) Prior Publication Data

US 2008/0191755 A1  Aug. 14, 2008

(51) Int. Cl.
*H03B 19/06* (2006.01)
(52) U.S. Cl. .................. 327/118; 327/203; 377/105
(58) Field of Classification Search ............... 327/118; 377/105
See application file for complete search history.

(56) References Cited

U.S. PATENT DOCUMENTS

| | | | | |
|---|---|---|---|---|
| 3,973,139 | A * | 8/1976 | Dingwall | 377/105 |
| 4,114,049 | A * | 9/1978 | Suzuki | 377/105 |
| 4,395,774 | A * | 7/1983 | Rapp | 377/114 |
| 6,130,564 | A | 10/2000 | Wang | |
| 6,166,571 | A | 12/2000 | Wang | |
| 7,304,519 | B2 * | 12/2007 | Neubauer | 327/203 |
| 2004/0036541 | A1 | 2/2004 | Fang et al. | |

FOREIGN PATENT DOCUMENTS

JP  62181524  8/1987
WO  2007004181  1/2007

OTHER PUBLICATIONS

Chih-Ming Hung et al. "A Digitally Controlled Oscillator System for SAW-Less Transmitters in Cellular Handsets". IEEE Journal of Solid-State Circuits, vol. 41, No. 5, May 2006. pp. 1160-1170.
Salvatore Levantino et al. "Phase Noise in Digital Frequency Dividers". IEEE Journal of Solid-State Circuits, vol. 39, No. 5, May 2004. pp. 775-784.
Jan Craninckx and Michael S. J. Steyaert. "A 1.75-GHz/3-V Dual-Modulus Divide-by-128/129 Prescaler in 0.7-μm CMOS". IEEE Journal of Solid-State Circuits, vol. 31, No. 7, Jul. 1996. pp. 890-897.
See Taur Lee et al. "A Quad-Band GSM-GPRS Transmitter With Digital Auto-Calibration". IEEE Journal of Solid-State Circuits, vol. 39, No. 12, Dec. 2004. pp. 2200-2214.
Chinese Office Action dated Apr. 22, 2009 issued in related Chinese Patent Application No. 200710146690 and English Machine Translation.

* cited by examiner

*Primary Examiner*—Lincoln Donovan
*Assistant Examiner*—John W Poos
(74) *Attorney, Agent, or Firm*—Grossman, Tucker, Perreault & Pfleger, PLLC

(57) ABSTRACT

A frequency divider has an inverting unit and a plurality of switch inverters in series. Each switch inverter comprises two inphase switches and is controlled by a clock. The two inphase switches of each switch inverter are respectively supplied by a first voltage and a second voltage, while any two switch inverters in series are respectively controlled by two inverted clocks. The two inphase switches are selectively turned on and off synchronously.

3 Claims, 4 Drawing Sheets

LOW-NOISE FREQUENCY DIVIDER

CROSS-REFERENCES TO RELATED APPLICATIONS

Not applicable.

BACKGROUND OF THE INVENTION

1. Field of the Invention

The present invention relates to a frequency divider; more particularly, the invention relates to a low-noise frequency divider dividing the high frequency of a clock by 2K.

2. Descriptions of the Related Art

Frequency dividers are widely applied in many fields. For example, in radio frequency (RF) transceivers, a TX RF low band requires a frequency divider to divide the frequency of a clock by four, while a TX RF high band requires a frequency divider divide the frequency of a clock by two. In addition, a RX low band requires a frequency divider to divide the frequency of a clock by four and output four quadrature signals.

Operation frequencies of the TX and RX modes differ by 20 mega Hz (20 MHz), therefore the TX mode is designed to have a lower phase noise at 20 MHz. There are two conventional designs of frequency dividers. One is the dynamic frequency divider, which has a low phase noise, but cannot deal with a high frequency clock. The other frequency divider is a source-coupled-logic (SCL) frequency divider, which can tolerate high frequency clicks, but lacks phase noise integrity.

U.S. Pat. No. 6,130,564 discloses a frequency divider with two inputs and one output. Even though the frequency divider performs a high frequency divider circuit, the frequency divider cannot perform a rail-to-rail swing range; therefore, the frequency divider may function incorrectly due to an indistinguishable signal caused by the non-rail-to-rail swing range.

The paper "A quad-bad GSM-GPRS transmitter with digital auto-calibration" presented in the 2004 JSSC discloses a frequency divider that applies charge sharing principles with the inverter-combined-transmission gate circuitry to achieve frequency dividing. However, due to resistance-like characters of the transmission gate, the charge flowing through the transmission gate cannot flow too quickly. Thus, the frequency divider cannot tolerate high frequency.

As a result, a low-noise frequency divider that divides the high frequency of a clock by 2K is needed in the communication industry.

SUMMARY OF THE INVENTION

The primary objective of this invention is to provide a frequency divider. The frequency divider comprises an inverting unit and a plurality of switch inverters. The inverting unit has an input and an output. The switch inverters have at least a first switch inverter and a last switch inverter Each of the switch inverters has two inphase switches. The first switch inverter is connected to the output of the inverting unit, while the last switch inverter is connected to the input of the inverting unit. The two inphase switches of each of the switch inverters are respectively supplied by a first voltage and a second voltage. Any of the two adjacent switch inverters are respectively controlled by two inverted clocks, thereby, the two inphase switches are selectively turned on and off synchronously.

Another objective of this invention is to provide a frequency divider. The frequency divider comprises a plurality of inverting modules in series, including at least a first inverting module, a second inverting module and a last inverting module. Each of the inverting modules comprises a first input, a second input, a first output, a second output, two switch inverters, and a switch cross coupler. The two switch inverters comprise two inphase switches that are respectively supplied by a first voltage and a second voltage. One of the switch inverters is connected to the first input and the first output, while the other switch inverter is connected to the second input and the second output. The switch cross coupler is connected to the first and the second outputs. The two switch inverters and the switch cross coupler are controlled by a clock. Any of the two adjacent inverting modules are respectively controlled by two inverted clocks. The first output of the first inverting module is connected to the first input of the second inverting module. The second output of the first inverting module is connected to the second input of the second inverting module. The first input of the first inverting module is connected to the second output of the last inverting module. The second input of the first inverting module is connected to the first output of the last inverting module, thereby, the two inphase switches of each of the inverting modules are selectively turned on and off synchronously. With these characteristics, the frequency divider, with low phase noise, can tolerate a high frequency clock.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
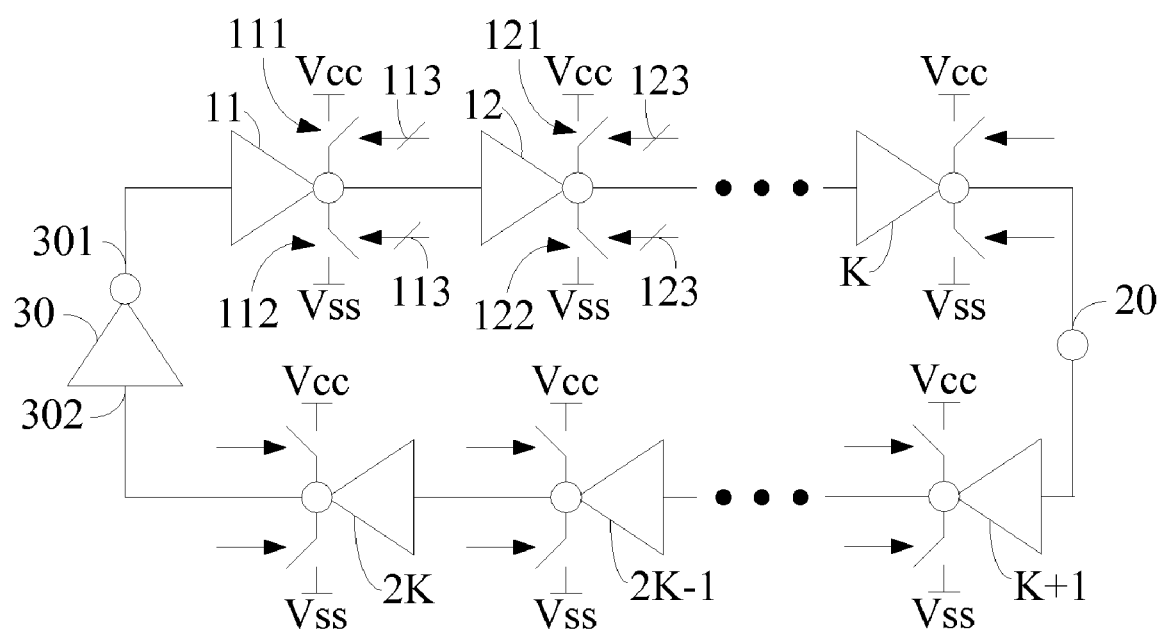
FIG. 1(a) is a first embodiment of the present invention.

FIG. 1(a) shows a first embodiment of the present invention. A frequency divider has an inverting unit, such as an inverter, and a plurality of switch inverters in series, with each switch inverter controlled by a clock. The frequency divider of the embodiment has 2K switch inverters in series, in which K is a positive integer. The frequency divider divides the frequency of a clock by 2K. In the first embodiment, a switch inverter 11 is connected to the output 301 of an inverter 30. The switch inverter 11 has two inphase switches 111, 112 controlled by a clock 113, which means the two switches 111, 112 are selectively turned on and off synchronously. The two switches 111, 112 are respectively supplied by a first voltage and a second voltage. In this first embodiment, the first voltage is a high voltage, Vcc, and the second voltage is a low voltage, Vss. Thus, the output of the switch inverter 11 can present a significant rail-to-rail output signal in response to an input signal of the switch inverter 11 when the two switches 111, 112 are turned on. For example, when the input signal of the switch inverter 11 is logically high, and the two switches 111, 112 are turned on, the output signal presents a voltage level close to Vss, i.e. logically low.

A switch inverter 12 is connected to the switch inverter 11 in series. The switch inverter 12 has two inphase switches 121, 122 controlled by a clock 123. The clock 123 and the clock 113 are inverted. For example, when the switches 111, 112 are turned on, the switches 121, 122 are turned off. The next switch inverter is then connected to the switch inverter 12 in series and controlled by an inverted clock 123. Following the aforementioned principle, any two adjacent switch inverters are respectively controlled by two inverted clocks.

The output 20 of the first embodiment is between switch inverter K and switch inverter K+1. An input 302 of the inverter 30 is then connected to the switch inverter 2K.

Figure 1B:
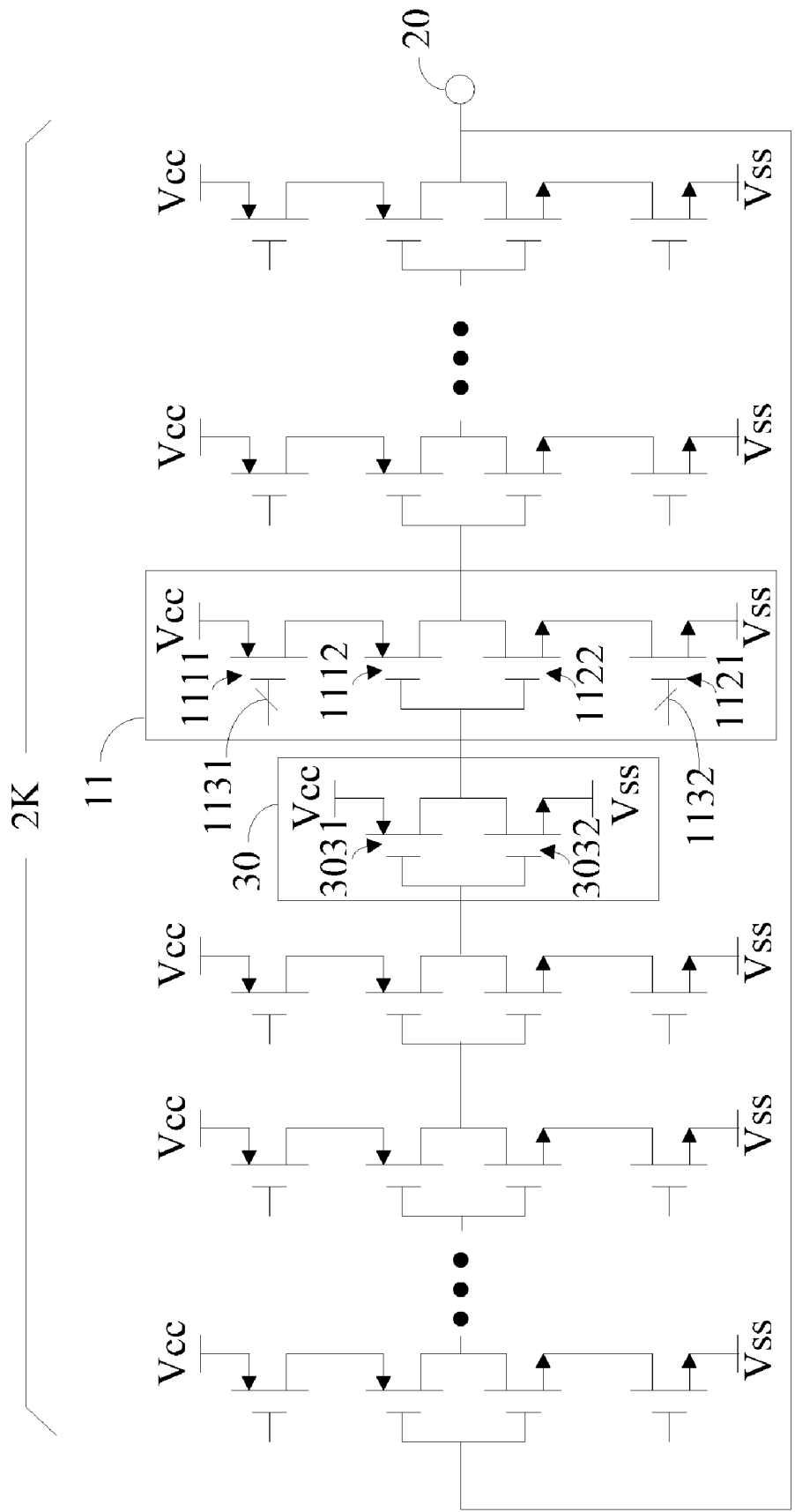
FIG. 1(b) is a schematic diagram of a second embodiment of the present invention.

FIG. 1(b) shows a schematic diagram of a second embodiment. The second embodiment can present substantially the same functions of the first embodiment. Devices applied in FIG. 1(b) are solely for illustration, and not a limitation of the present invention. The second embodiment has an inverter 30 and a plurality of switch inverters. The switch inverter 11 has a first PMOS 1111, a second PMOS 1112, a first NMOS 1121, and a second NMOS 1122. Each of the MOSs comprises a gate, a drain, and a source. The first PMOS 1111 is applied on the switch 111 in FIG. 1(a), while the first NMOS 1121 is applied on the switch 112 in FIG. 1(a). The second PMOS 1112 and the second NMOS 1122 are applied as inverting modules of the switch inverter 11 for generating the output signal inverted to the input signal.

To make the first PMOS 1111 and the first NMOS 1121, i.e. the switches, selectively turned on and off synchronously as described in the first embodiment, the first PMOS 1111 and the first NMOS 1121 are controlled by two inverted clocks, respectively. Due to the complementary characteristics of the PMOS and NMOS, the first PMOS 1111 and the first NMOS 1121 are controlled by clocks 1131, 1132, respectively, wherein the clocks 1131, 1132 are inverted.

The source of the first PMOS 1111 is supplied by the high voltage, Vcc, while the gate of the first PMOS is controlled by a clock 1131. Other connections are illustrated as follows: (1) the drain of the first PMOS 1111 is connected to the source of the second PMOS 1112, (2) the gate of the second PMOS 1112 is connected to the gate of the second NMOS 1122, (3) the drain of the second PMOS 1112 is connected to the drain of the second NMOS 1122, (4) the source of the second NMOS 1122 is connected to the drain of the first NMOS 1121, (5) the gate of the first NMOS 1121 is controlled by the clock 1132, and (6) the source of the first NMOS 1121 is supplied by the low voltage, Vss.

In addition, the inverter 30 comprises a PMOS 3031 and a NMOS 3032, with the source of the PMOS 3031 supplied by the Vcc. In addition, the gate of the PMOS 3031 is connected to the gate of the NMOS 3032, while the drain of the PMOS 3031 is connected to the drain of the NMOS 3032 and the drain of the second NMOS 1122. The source of the NMOS 3032 is supplied by the Vss.

Connections of the remaining devices of the second embodiment are substantially the same as described in the first embodiment, and are not described herein.

Figure 2A:
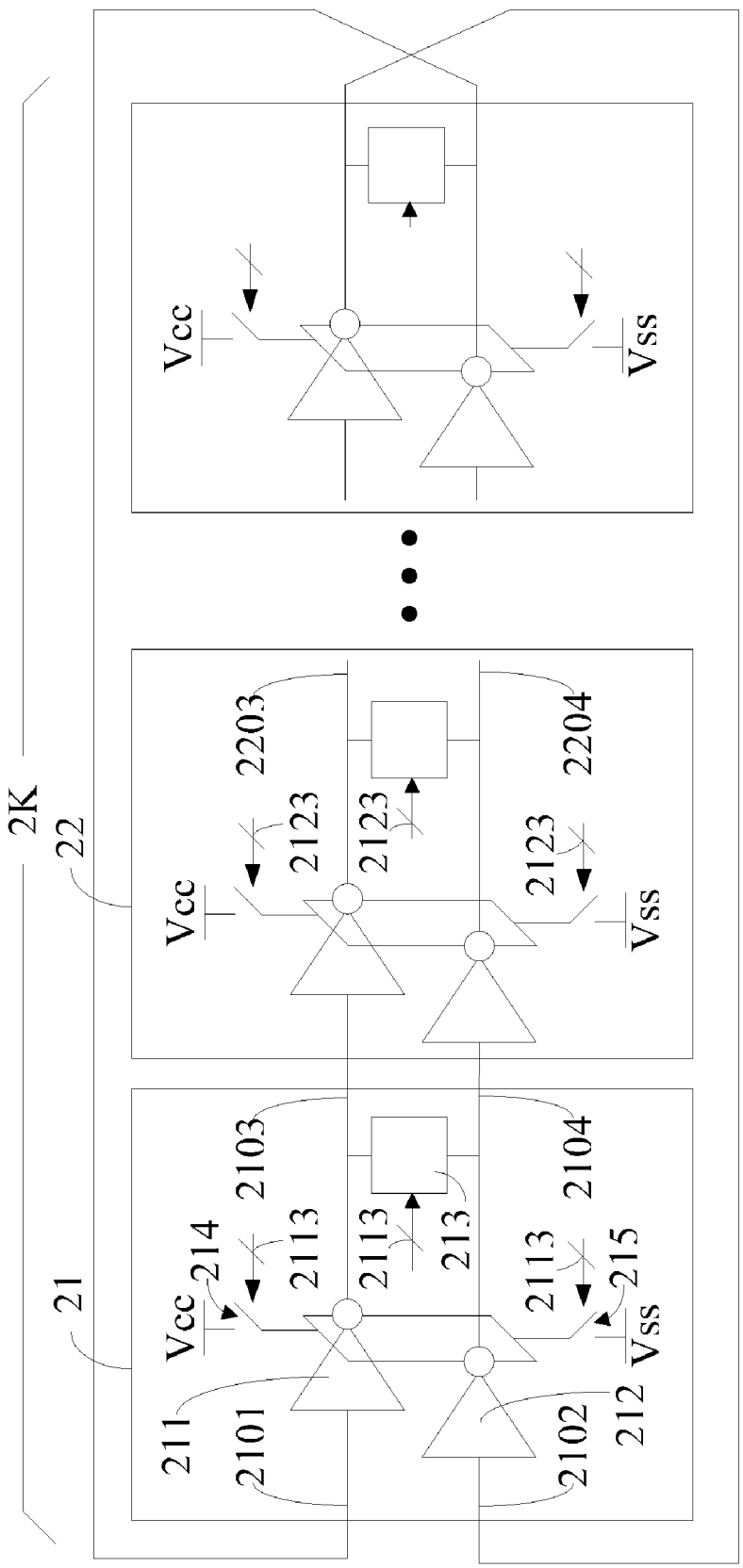
FIG. 2(a) is a third embodiment of the present invention.

FIG. 2(a) shows a third embodiment of the present invention. The third embodiment has a plurality of inverting module in series. An inverting module 21, denoted as a first inverting module of the embodiment, comprises a first input 2101, a second input 2102, a first output 2103, a second output 2104, two switch inverters 211, 212, a switch coupler 213, and two switches 214, 215. The frequency divider of the embodiment has 2K inverting modules in series, in which K is a positive integer, and the frequency divider divides the frequency of a clock by 2K. The switch inverter 211 is connected to the first input 2101 and the first output 2103. The switch 212 is connected to the second input 2102 and the second output 2104. The switch coupler 213 is connected to the first output 2103 and the second output 2104. The switch 214 is connected to the switch inverters 211 and 212, and supplied by a first voltage. The switch 215 is connected to the switch inverters 211 and 212, and supplied by a second voltage. In this embodiment, the first voltage is a high voltage, Vcc, while the second voltage is a low voltage, Vss. The switches 214, 215, and the switch coupler 213 are controlled by a clock 2113, which means that the two switches 211, 212 are selectively turned on and off synchronously. When the two switches are turned on, the switch coupler 213 is enabled.

An inverting module 22 is connected to the inverting module 21 in series. The inverting module 22 has the same devices of the inverting module 21 and is connected to the inverting module 21 in series. The inverting module 22 is controlled by a clock 2123. The clocks 2123, 2113 are inverted. Following the aforementioned principle, any two inverting modules in series are respectively controlled by two inverted clocks.

The first output of the last inverting module is connected to the second input 2102 of the inverting module 21, and a second output of the last inverting module is connected to the first input 2101 of the inverting module 21.

In the third embodiment, four outputs of two consecutive inverting modules present four quadrature signals, and the frequency of a clock, such as the clock 2123, is 2K times larger than the frequency of each of the four quadrature signals. For example, the outputs 2103, 2104 of the inverting module 21, and outputs 2203, 2204 of the inverting module 22 are quadrature.

Figure 2B:
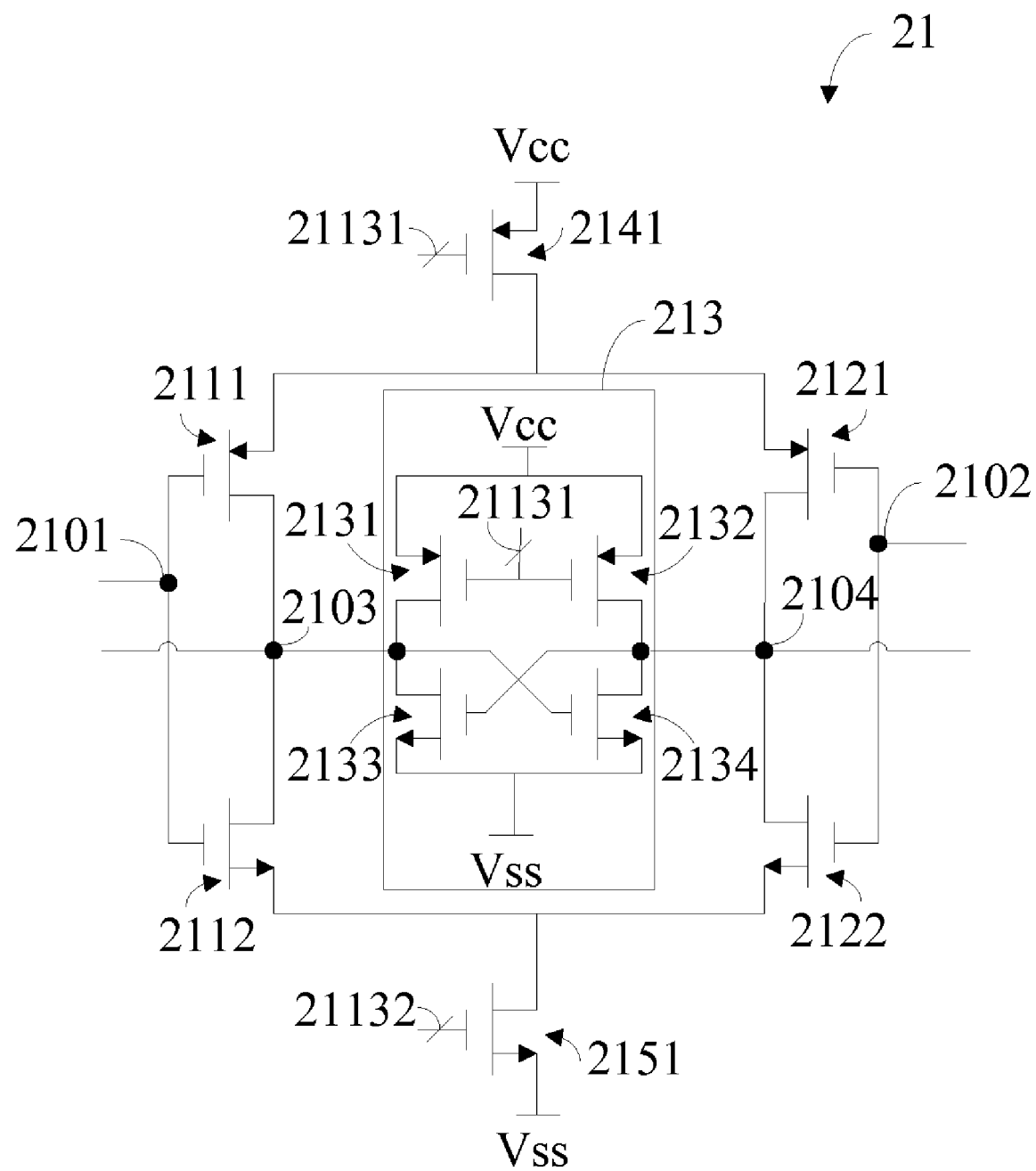
FIG. 2(b) is a schematic diagram of a fourth embodiment of the present invention.

FIG. 2(b) shows a schematic diagram of an inverting module of a fourth embodiment. The fourth embodiment can present substantially the same functions of the third embodiment. Devices applied in FIG. 2(b) are solely for illustration, and not a limitation of the present invention. The switch cross coupler 213 comprises a first switch PMOS 2131, a second switch PMOS 2132, a first NMOS 2133 and a second NMOS 2134. The first switch 2131 is supplied by the Vcc and a drain of the first NMOS 2133. The second switch 2132 is supplied by the Vcc and a drain of the second NMOS 2134. The gate of the first NMOS 2133 is connected to the second output 2104, as shown in FIG. 2(b). The gate of the second NMOS 2134 is connected to the first output 2103, as shown in FIG. 2(b). The source of the first NMOS 2133 and the source of the second NMOS 2134 are both supplied by the Vss. The source of the first switch PMOS 2131 and the source of the second PMOS 2132 are supplied by the Vcc. The gate of the first switch PMOS 2131 and the gate of the second PMOS 2132 are controlled by a first clock 21131. The drain of the first switch PMOS 2131 is connected to the drain of the first NMOS 2131. The drain of the second switch PMOS 2132 is connected to the drain of the second NMOS 2134.

The switch 214 in FIG. 2(a) is illustrated as a PMOS 2141 in FIG. 2(b), and the switch 215 in FIG. 2(a) is illustrated as a NMOS 2151 in FIG. 2(b). The switch inverter 211 comprises a PMOS 2111 and a NMOS 2112, while the switch 212 comprises a PMOS 2121 and a NMOS 2122. Each of the MOSs comprises a gate, a drain, and a source.

The source of the PMOS 2141 is supplied by the Vcc, while the source of the NMOS 2151 is supplied by the Vss. The connections are as follows: (1) the gate of the PMOS 2141 is controlled by the first clock 21131, (2) the drain of the PMOS 2141 is connected to the source of the PMOS 2111, (3) the gate of the PMOS 2111 is connected to the gate of the NMOS 2112, (4) the drain of the PMOS 2111 is connected to the drain of the NMOS 2112, (5) the source of the NMOS 2112 is connected to the drain of the NMOS 2151, and (6) the gate of the NMOS 2151 is controlled by a second clock 21132 that is inverted to the first clock 21131.

Similarly, the source of the PMOS 2121 is connected to the drain of the PMOS 2141, while the gate of the PMOS 2121 is connected to the gate of the NMOS 2122. In addition, the drain of the PMOS 2121 is connected to the drain of the NMOS 2122, and the source of the NMOS 2122 is connected to the drain of the NMOS 2151. The first input 2101 is connected to the gate of the PMOS 2111. The first output 2103 is connected to the gate of the second NMOS 2134 and the drain of the NMOS 2112. The second input 2102 is connected to the gate of the PMOS 2121. The second output 2104 is connected to the gate of the first NMOS 2133 and the drain of the NMOS 2122.

To selectively turn the switches on and off synchronously in the fourth embodiment as described in the third embodiment, the PMOS 2141, the first switch PMOS 2131, and the second switch PMOS 2132 are controlled by the first clock 21131, while the NMOS 2151 is controlled by the second clock 21132, wherein the first clock 21131 and the clock 21132 are inverted.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An inverting module, adopted in a frequency divider, comprising:
    a first source node configured to receive a first voltage;
    a second source node configured to receive a second voltage;
    a first input node and a second input node;
    a first output node and a second output node;
    a switch cross coupler, including:
        a multivibrator circuit, having at least a first transistor having a first terminal and a second terminal and a second transistor having a first terminal and a second terminal, wherein the first terminal of the first transistor and the first terminal of the second transistor are both directly connected to the second source terminal;
        a first switch device, disposed between the second terminal of the first transistor of the multivibrator circuit and the first source node, wherein the first switch device is controlled by a clock;
        a second switch device, disposed between the second terminal of the second transistor of the multivibrator circuit and the first source node, wherein the second switch device is controlled by the clock; and
        a set of switch inverters, including a first inverter and a second inverter, being configured to couple to the first source node and the second source node;
            wherein the first inverter is coupled to the first switch device, and is coupled between the first input node and the first output node; and
            wherein the second inverter is coupled to the second switch device, and is coupled between the second input node and the second output node.

2. The inverting module according to claim 1, wherein the frequency divider includes a plurality of inverting modules.

3. A frequency divider, comprising:
    at least two inverting modules including a first inverting module and a second inverting module, wherein the at least two inverting modules are connected between a first source node receiving a first voltage and a second source node receiving a second voltage, wherein the first inverting module comprises:
        a first input node and a second input node;
        a first output node and a second output node;
        a first switch cross coupler, including:
            a first multivibrator circuit, having at least a first transistor having a first terminal and a second terminal and a second transistor having a first terminal and a second terminal, wherein the first terminal of the first transistor and the first terminal of the second transistor are both directly connected to the second source node;
            a first switch device, disposed between the second terminal of the first transistor of the first multivibrator circuit and the first source node, wherein the first switch device is controlled by a first clock; and
            a second switch device, disposed between the second terminal of the second transistor of the first multivibrator circuit and the first source node, wherein the second switch device is controlled by the first clock; and
        a first set of switch inverters, including a first inverter and a second inverter, being configured to couple to the first source node and the second source node; wherein the first inverter is coupled to the first switch device, and is coupled between the first input node and the first output node of the first inverting module; wherein the second inverter is coupled to the second switch device, and is coupled between the second input node and the second output node of the first inverting module; and wherein the second inverting module comprises:
        a first input node and a second input node;
        a first output node and a second output node;
        a second switch cross coupler, including:
            a second multivibrator circuit, having at least a first transistor having a first terminal and a second terminal and a second transistor having a first terminal and a second terminal, wherein the first terminal of the first transistor and the first terminal of the second transistor are both directly connected to the second source node;
            a third switch device, disposed between the second terminal of the first transistor of the second multivibrator circuit and the first source node, wherein the third switch device is controlled by a second clock; and
            a fourth switch device, disposed between the second terminal of the second transistor of the second multivibrator circuit and the first source node, wherein the fourth switch device is controlled by the second clock; and
        a second set of switch inverters, including a third inverter and a fourth inverter, being configured to couple to the first source node and the second source node; wherein the third inverter is coupled to the third switch device, and is coupled between the first input node and the first output node of the second inverting module; wherein the fourth inverter is coupled to the fourth switch device, and is coupled between the second input node and the second output node of the second inverting module; and wherein the first inverting module and the second inverting module are controlled by two inverted clocks, respectively, the first output node of the first inverting module is connected to the first input node of the second inverting module, and the second output node of the first inverting module is connected to the second input node of the second inverting module, thereby the first and the second inverting modules are selectively turned on and turned off synchronously.

* * * * *